(12) United States Patent
Ono et al.

(10) Patent No.: US 8,823,612 B2
(45) Date of Patent: Sep. 2, 2014

(54) ORGANIC EL DISPLAY DEVICE

(71) Applicant: Panasonic Corporation, Osaka (JP)

(72) Inventors: Shinya Ono, Osaka (JP); Masafumi Matsui, Kyoto (JP); Kouhei Ebisuno, Kyoto (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 13/709,617

(22) Filed: Dec. 10, 2012

(65) Prior Publication Data

US 2013/0100002 A1    Apr. 25, 2013

Related U.S. Application Data

(63) Continuation of application No. PCT/JP2010/004083, filed on Jun. 18, 2010.

(51) Int. Cl.
| | |
|---|---|
| G09G 3/30 | (2006.01) |
| G09G 5/00 | (2006.01) |
| H05B 33/08 | (2006.01) |
| H01L 27/32 | (2006.01) |
| H01L 51/52 | (2006.01) |

(52) U.S. Cl.
CPC .............. G09G 3/30 (2013.01); H01L 51/5228 (2013.01); H01L 27/2376 (2013.01); H05B 33/0896 (2013.01); H01L 27/3258 (2013.01)
USPC .......................................... 345/76; 345/211

(58) Field of Classification Search
USPC .................... 345/76, 211, 212, 205, 173, 178
See application file for complete search history.

(56) References Cited

U.S. PATENT DOCUMENTS

| 6,633,270 B2 | 10/2003 | Hashimoto |
| 6,887,100 B2 | 5/2005 | Matsueda et al. |
| 7,161,184 B2 | 1/2007 | Miyagi et al. |
| 7,198,515 B2 | 4/2007 | Matsueda et al. |

(Continued)

FOREIGN PATENT DOCUMENTS

| JP | 2002-040961 | 2/2002 |
| JP | 2003-059660 | 2/2003 |

(Continued)

OTHER PUBLICATIONS

U.S. Appl. No. 13/487,788 to Shinya Ono et al., which was filed on Jun. 4, 2012.

(Continued)

*Primary Examiner* — Michael Faragalla
(74) *Attorney, Agent, or Firm* — Greenblum & Bernstein, P.L.C.

(57) ABSTRACT

An organic electro-luminescence (EL) display device including: above a substrate, scanning lines; data lines; emissive pixels disposed near cross-points of the scanning lines and the data lines; and power supply lines for supplying currents to the emissive pixels, wherein the emissive pixels each have: a switching thin film transistor having a gate to which a scan signal is supplied via one of the scanning lines; a current control thin film transistor for controlling a current to be applied to the emissive pixel, in accordance with the voltage determined based on a data voltage supplied from one of the data lines via the switching thin film transistor; and an organic EL element to which a current is supplied from one of the power supply lines via the current control thin film transistor, the organic EL element including a lower electrode, an organic light-emissive layer, and an upper electrode.

11 Claims, 7 Drawing Sheets

(56) References Cited

U.S. PATENT DOCUMENTS

| | | |
|---|---|---|
| 7,221,095 B2 | 5/2007 | Yamazaki et al. |
| 7,291,970 B2 | 11/2007 | Kuwabara |
| 7,545,347 B2 | 6/2009 | Kanda |
| 7,579,774 B2 | 8/2009 | Yamazaki et al. |
| 7,714,815 B2 | 5/2010 | Kim et al. |
| 7,719,011 B2 | 5/2010 | Kubota |
| 7,825,406 B2 | 11/2010 | Yoshida et al. |
| 7,884,786 B2 | 2/2011 | Kim et al. |
| 7,943,938 B2 * | 5/2011 | Miyagi et al. ............ 257/72 |
| RE42,623 E | 8/2011 | Matsueda et al. |
| 8,130,174 B2 | 3/2012 | Lee et al. |
| 2002/0011976 A1 | 1/2002 | Hashimoto |
| 2004/0115989 A1 | 6/2004 | Matsueda et al. |
| 2005/0012454 A1 | 1/2005 | Yamazaki et al. |
| 2005/0051776 A1 | 3/2005 | Miyagi et al. |
| 2005/0057151 A1 | 3/2005 | Kuwabara |
| 2005/0057460 A1 | 3/2005 | Lee et al. |
| 2005/0162353 A1 | 7/2005 | Kanda |
| 2005/0186839 A1 | 8/2005 | Matsueda et al. |
| 2006/0107143 A1 | 5/2006 | Kim et al. |
| 2006/0139255 A1 | 6/2006 | Kim et al. |
| 2007/0108440 A1 | 5/2007 | Kubota |
| 2007/0205718 A1 | 9/2007 | Yamazaki et al. |
| 2007/0241664 A1 | 10/2007 | Sakamoto et al. |
| 2007/0257602 A1 | 11/2007 | Miyagi et al. |
| 2009/0091521 A1 | 4/2009 | Kanda |
| 2009/0286445 A1 | 11/2009 | Yamazaki et al. |
| 2010/0194272 A1 | 8/2010 | Kubota |
| 2010/0277449 A1 | 11/2010 | Kanda |
| 2011/0210335 A1 * | 9/2011 | Miyagi et al. ............ 257/59 |
| 2012/0147070 A1 | 6/2012 | Segawa et al. |
| 2012/0154460 A1 | 6/2012 | Segawa et al. |

FOREIGN PATENT DOCUMENTS

| | | |
|---|---|---|
| JP | 2004-127933 | 4/2004 |
| JP | 2004-139970 | 5/2004 |
| JP | 2005-031645 | 2/2005 |
| JP | 2005-038833 | 2/2005 |
| JP | 2005-070741 | 3/2005 |
| JP | 2005-189304 | 7/2005 |
| JP | 2005-208346 | 8/2005 |
| JP | 2005-215354 | 8/2005 |
| JP | 2006-011059 | 1/2006 |
| JP | 2006-058815 | 3/2006 |
| JP | 2006-113548 | 4/2006 |
| JP | 2007-156387 | 6/2007 |
| JP | 2007-232796 | 9/2007 |
| JP | 2007-287354 | 11/2007 |
| JP | 2009-116349 | 5/2009 |
| JP | 2009-259475 | 11/2009 |

OTHER PUBLICATIONS

ISR dated Sep. 21, 2010 and English translation.

* cited by examiner (b)

(a)

ORGANIC EL DISPLAY DEVICE

CROSS REFERENCE TO RELATED APPLICATION

This is a continuation application of PCT Patent Application No. PCT/JP2010/004083 filed on Jun. 18, 2010, designating the United States of America. The entire disclosure of the above-identified application, including the specification, drawings and claims are incorporated herein by reference in its entirety.

TECHNICAL FIELD

One or more exemplary embodiments disclosed herein relate generally to organic EL display devices.

BACKGROUND ART

In organic Electro-Luminescence (EL) display devices, a power supply line through which a current is applied to an organic EL element, namely, a power supply line connected to a current control thin film transistor (Hereinafter, also simply referred to as "TFT.") is disposed, for example, on one or both of a source-drain layer and a gate layer included in the TFT (for example, see PTL 1), or is disposed below a layer (Hereinafter, also referred to as "TFT layer.") in which the TFT is formed (for example, see PTL 2). Alternatively, for example, the width of the power supply line is increased. This is to prevent non-uniformity of brightness and the like due to voltage drop caused by wiring resistance of the power supply line.

CITATION LIST

Patent Literature

[PTL 1] Japanese Unexamined Patent Application
[PTL 2] Japanese Unexamined Patent Application Publication No. 2005-215354

SUMMARY

Technical Problem

However, the conventional approach as described above such as disposing the power supply line in the conventional manner and increasing the width of the power supply line arises a problem that, due to parasitic capacitance between a power supply line and control lines such as a scanning line across a row direction and a data line across a column direction of a screen of the organic EL display device, the time constant of the control line increases. Thus it is difficult to transmit a signal at high frequency, namely, to drive the organic EL element at high-speed. This increases difficulty for upsizing and increased resolution of screens of organic EL display devices.

One non-limiting and exemplary embodiment provides an organic EL display device in which how the power supply lines are disposed is devised to inhibit an increase in time constant of the control line, so that upsizing and increased resolutions of screens of organic EL display devices are achieved.

Solution to Problem

In one general aspect, the techniques disclosed here feature an organic EL display device including: above a substrate, plural scanning lines; plural data lines; emissive pixels disposed near cross-points of the plural scanning lines and the plural data lines; and power supply lines for supplying currents to the emissive pixels, wherein the emissive pixels each have: a switching thin film transistor having a gate to which a scan signal is supplied via one of the plural scanning lines; a current control thin film transistor for controlling a current to be applied to the emissive pixel, in accordance with a voltage applied to a gate of the current control thin film transistor, the voltage being determined based on a data voltage supplied from one of the plural data lines to the gate of the current control thin film transistor via the switching thin film transistor; and an organic EL element to which a current is supplied from one of the power supply lines via the current control thin film transistor, the organic EL element including a lower electrode, an organic light-emissive layer, and an upper electrode, the organic EL display device further including: a planarization layer provided above a layer in which the plural scanning lines and the plural data lines are disposed; and the power supply lines, the lower electrodes, and auxiliary lines electrically connected to the upper electrode, which are disposed above the planarization layer, wherein the power supply lines have points where the power supply lines cross the plural scanning lines, having the planarization layer disposed between the power supply lines and the plural scanning lines, and points where the power supply lines cross the plural data lines, having the planarization layer disposed between the power supply lines and the plural data lines.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to one or more exemplary embodiments or features disclosed herein, an organic EL display device can be achieved which reduces the parasitic capacitance formed of the power supply line and the control line, and allows for upsizing and increased resolution of a screen.

Thus, the present disclosure has significant practical value for its application to displays for TVs and computers desired for larger display screens and display screens having higher resolutions.

BRIEF DESCRIPTION OF DRAWINGS

These and other advantages and features will become apparent from the following description thereof taken in conjunction with the accompanying Drawings, by way of non-limiting examples of embodiments of the present disclosure.

In the Drawings.

Figure 3:
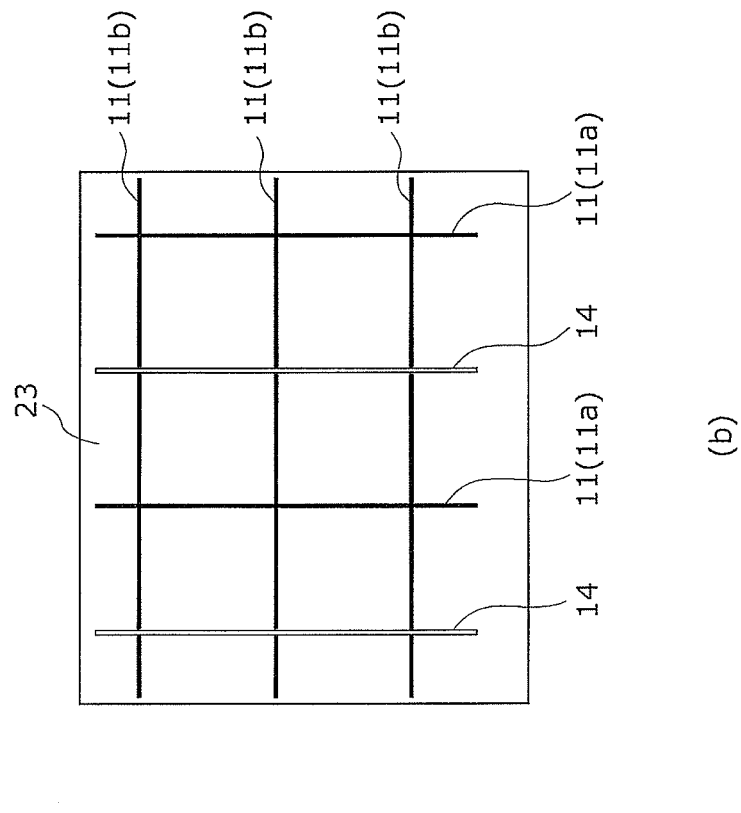
Figure 3:
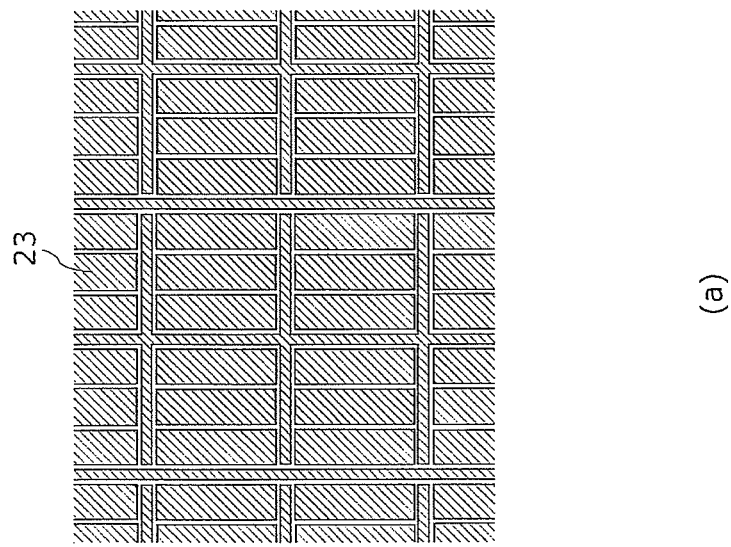

Parts (a) and (b) of FIG. 3 are layout views of a lower electrode layer of the organic EL display device.

Figure 4:
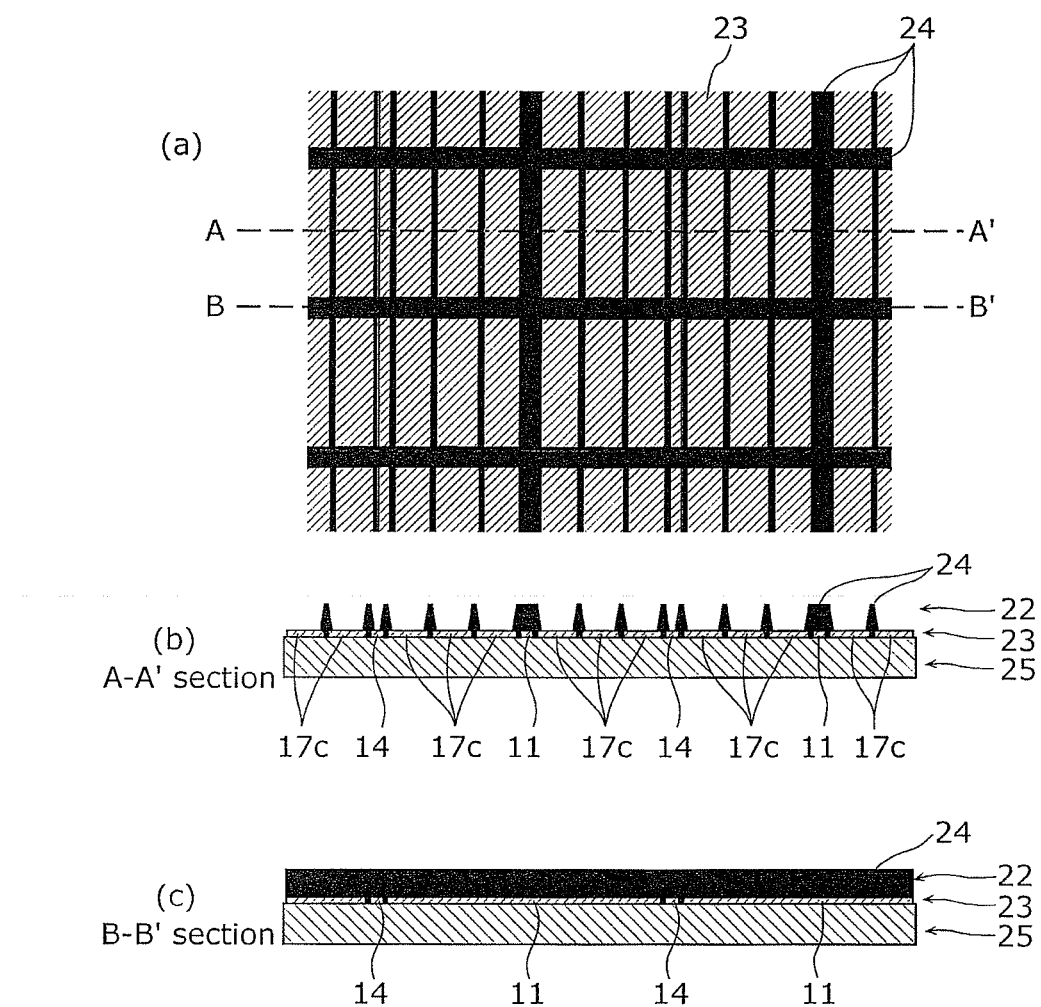

Part (a) of FIG. 4 is a layout view of the lower electrode layer and an emissive layer (partitions) of the organic EL display device, and (b) and (c) of FIG. 4 are cross-sectional views of the lower electrode layer and the partitions taken along AA' line and BB' line, respectively, shown in (a) of FIG. 4.

Figure 5:
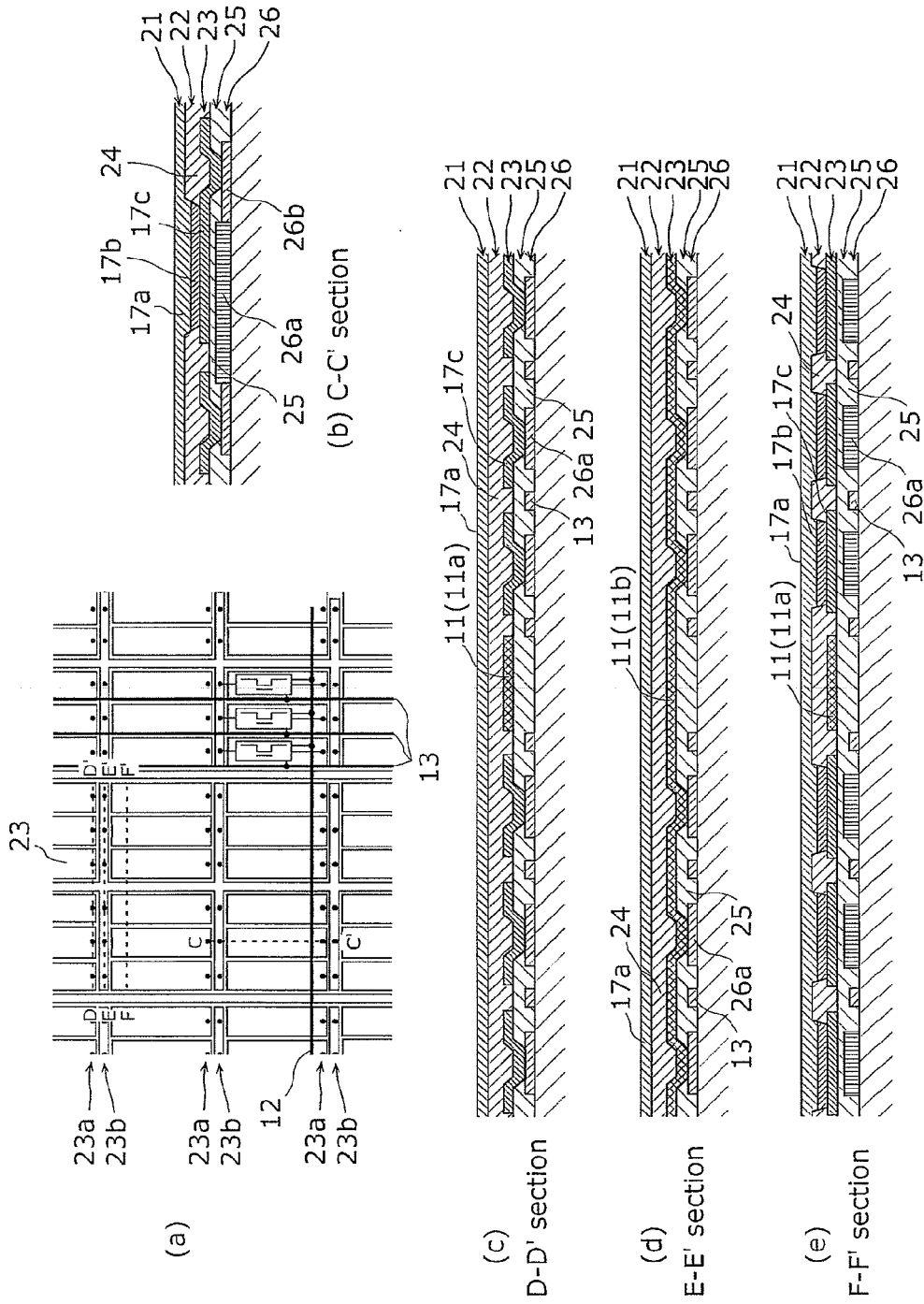

Part (a) of FIG. 5 is a layout view of the lower electrode layer (including first TFT contacts and second TFT contacts) of the organic EL display device, and (b), (c), (d), and (e) of FIG. 5 are cross-sectional views of the organic EL display device taken along CC' line, DD' line, EE' line, FF' line, respectively, shown in (a) of FIG. 5.

Figure 6:
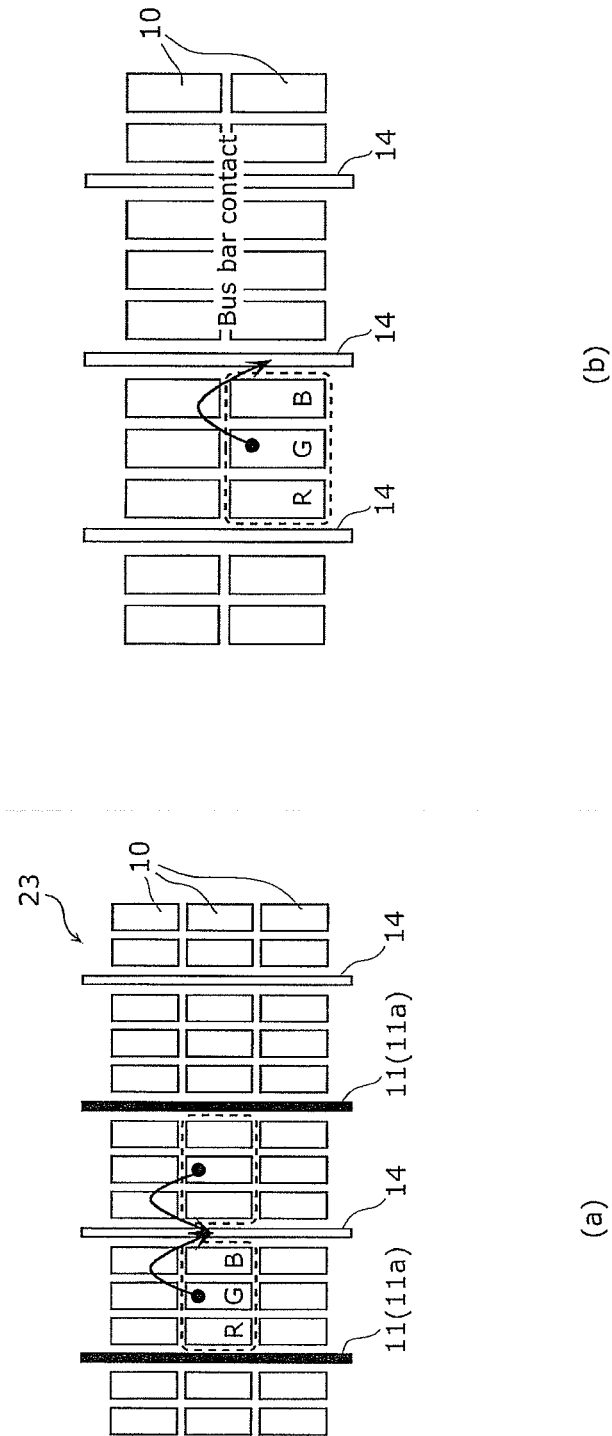

Part (a) of FIG. 6 is a diagram showing a connection relationship between power supply lines, auxiliary lines, and the emissive pixels disposed in the lower electrode layer of the organic EL display device, and (b) of FIG. 6 is a diagram showing a connection relationship between the auxiliary lines and the emissive pixels in a conventional technology in which the power supply lines are not disposed in the lower electrode layer.

Figure 7:
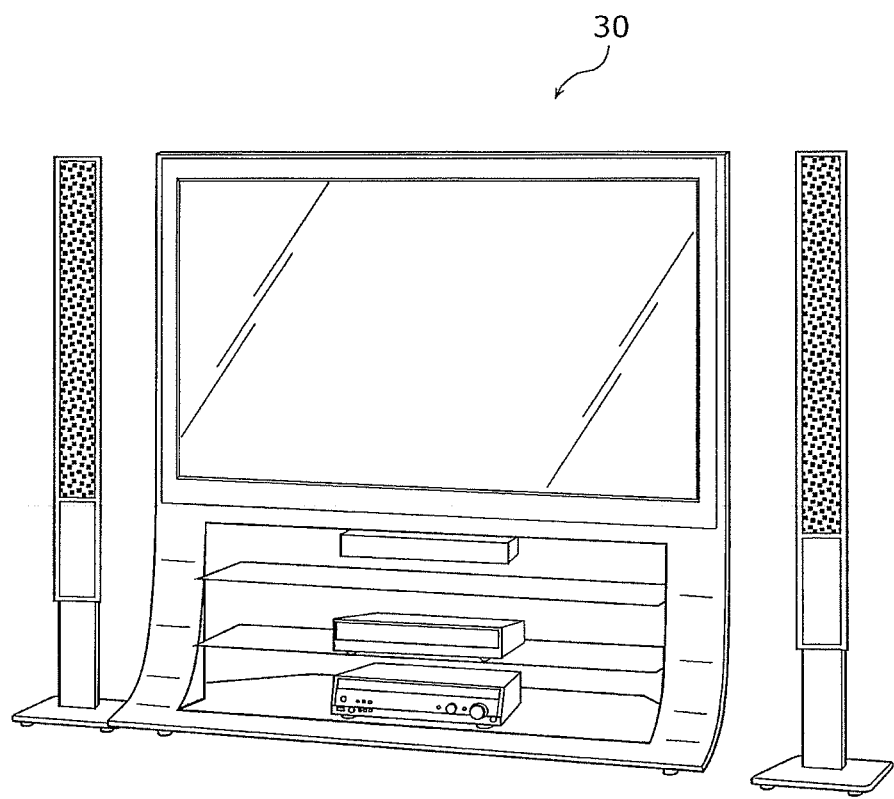

FIG. 7 is a diagram showing application of the organic EL display device according to the embodiment.

DESCRIPTION OF EMBODIMENT

According an exemplary embodiment disclosed herein, an organic EL display device includes, above a substrate, plural scanning lines; plural data lines; emissive pixels disposed near cross-points of the plural scanning lines and the plural data lines; and power supply lines for supplying currents to the emissive pixels, wherein the emissive pixels each have: a switching thin film transistor having a gate to which a scan signal is supplied via one of the plural scanning lines; a current control thin film transistor for controlling a current to be applied to the emissive pixel, in accordance with a voltage applied to a gate of the current control thin film transistor, the voltage being determined based on a data voltage supplied from one of the plural data lines to the gate of the current control thin film transistor via the switching thin film transistor; and an organic EL element to which a current is supplied from one of the power supply lines via the current control thin film transistor, the organic EL element including a lower electrode, an organic light-emissive layer, and an upper electrode, the organic EL display device further including: a planarization layer provided above a layer in which the plural scanning lines and the plural data lines are disposed; and the power supply lines, the lower electrodes, and auxiliary lines electrically connected to the upper electrode, which are disposed above the planarization layer, wherein the power supply lines have points where the power supply lines cross the plural scanning lines, having the planarization layer disposed between the power supply lines and the plural scanning lines, and points where the power supply lines cross the plural data lines, having the planarization layer disposed between the power supply lines and the plural data lines.

According to the above configuration, the power supply lines and the scanning lines are spaced from each other by the planarization layer (an interlayer insulating film). Thus, the parasitic capacitance formed of the power supply lines and the scanning lines is reduced as compared to the conventional technology in which the power supply lines and the scanning lines are formed in the same layer (for example, a layer in which the TFTs are formed). Thus, signals at high frequency can be transmitted to the scanning lines.

Moreover, since the power supply lines and the scanning lines are manufactured spaced from each other by a thickness of the interlayer insulating film, shorting defects are reduced and the yield rate of the organic EL display device improves, as compared to the conventional technology in which the power supply lines and the scanning lines are formed in the same layer (in which the TFTs are formed, for example).

Furthermore, to reduce the parasitic capacitance formed of the power supply lines and the scanning lines, the interlayer insulating film for planarizing the layer in which the TFTs are formed is used rather than providing a special spacing layer. Thus, manufacturing cost is reduced as compared to the case where the special spacing layer is provided.

Here, the lower electrodes may be disposed above the interlayer insulating film and the power supply lines may be formed in a same layer as the lower electrodes. Alternatively, the organic EL display device may further include auxiliary lines disposed above the interlayer insulating film, wherein the upper electrode may be connected to the emissive pixels in a shared manner and electrically connected to the auxiliary lines, and the power supply lines may be formed in a same layer as the auxiliary lines. In short, the power supply lines, the auxiliary lines, and the lower electrodes may be formed in the same layer. This forms, in the same layer, not only the lower electrodes of the organic EL elements but also the power supply lines and the auxiliary lines. Thus, the lower electrodes, the power supply lines, and the auxiliary lines can be concurrently formed by one wiring process. Therefore, manufacturing cost is reduced as compared to a method requiring for multiple manufacturing processes.

Here, preferably, the interlayer insulating film comprises organic compounds. More preferably, a value obtained by dividing a dielectric constant of the planarization layer by a film thickness of the interlayer insulating film is smaller than $4 \times 10^{-6}$ m$^{-1}$. This assures, for example, that the interlayer insulating film has the film thickness of 1 μm or greater, and capacitance of the parasitic capacitance formed of the power supply lines and the scanning lines is constrained to a significantly small value.

Moreover, partitions for spacing the organic light-emissive layer for each of the emissive pixels may be disposed above the power supply lines. This allows for a structure in which the power supply lines are covered by the partitions which are insulator, thereby reducing the frequency of occurrence of short circuit faults caused by the power supply lines contacting other lines.

Moreover, the auxiliary lines may be disposed in parallel with the power supply lines. This reduces areas at which the power supply line and the auxiliary line having different polarities cross each other, thereby inhibiting the frequency of occurrence of shorting defects caused by the power supply line and the auxiliary line contacting each other.

Hereinafter, a certain exemplary embodiment is described in greater detail with reference to the accompanying Drawings.

The exemplary embodiment described below shows a general or specific example. The numerical values, shapes, materials, structural elements, the arrangement and connection of the structural elements, steps, the processing order of the steps etc. shown in the following exemplary embodiment are mere examples, and therefore do not limit the scope of the appended Claims and their equivalents. Therefore, among the structural elements in the following exemplary embodiment, structural elements not recited in any one of the independent claims are described as arbitrary structural elements.

Figure 1:
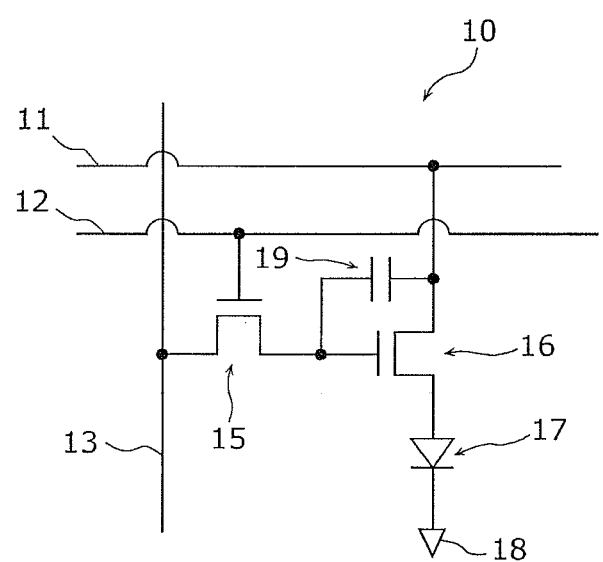
FIG. 1 is a circuit diagram of each of emissive pixels included in an organic EL display device according to an exemplary embodiment.

FIG. 1 is a circuit diagram of each of emissive pixels 10 included in the organic EL display device according to one exemplary embodiment. The emissive pixels 10 each include a switching thin film transistor 15, a current control thin film transistor 16, an organic EL element 17, and a capacitor 19. FIG. 1 also shows the following: a power supply line 11 for supplying a current to be applied to the organic EL element 17

(i.e., the power supply line 11 connected to the current control thin film transistor 16); a scanning line 12 across a row direction of a screen of the organic EL display device, for conveying a scan signal which is a control signal for selecting the emissive pixels 10 on the same row; a data line 13 across a column direction of the screen of the organic EL display device, for conveying data (data voltage) to be written to the emissive pixels 10 selected by the scanning line 12; and a voltage reference 18 connected to the cathode of the organic EL element 17.

The switching thin film transistor 15 is a select transistor which controls whether data transmitted via the data line 13 is to be written to the emissive pixel 10. Examples of the switching thin film transistor 15 include an NMOS transistor. The gate of the switching thin film transistor 15 is connected to the scanning line 12, one of the drain and the source of the switching thin film transistor 15 is connected to the data line 13, and the other of the drain and the source is connected to the gate of the current control thin film transistor 16 and one end of the capacitor 19.

The current control thin film transistor 16 is a TFT which controls a current to be applied to the organic EL element 17. Examples of the current control thin film transistor 16 include an NMOS transistor. The gate of the thin film transistor 16 is connected to the other of the drain and the source of the switching thin film transistor 15 and the one end of the capacitor 19, the drain of the current control thin film transistor 16 is connected to the power supply line 11 and the other end of the capacitor 19. The source of the current control thin film transistor 16 is connected to the anode of the organic EL element 17. The current control thin film transistor 16 may be a PMOS. In this case, the source of the current control thin film transistor 16 is connected to the power supply line 11, and the drain of the current control thin film transistor 16 is connected to the anode of the organic EL element 17.

The capacitor 19 is capacitance connected between the gate of the current control thin film transistor 16 and the power supply line 11, and serves as a memory element storing data transmitted from the data line 13 via the switching thin film transistor 15.

The organic EL element 17 is formed of a lower electrode (anode), an organic light-emissive layer, and an upper electrode (cathode) from bottom to top in a stacking direction. The anode is connected to the source of the current control thin film transistor 16, and the cathode is connected to the voltage reference 18.

Figure 2:
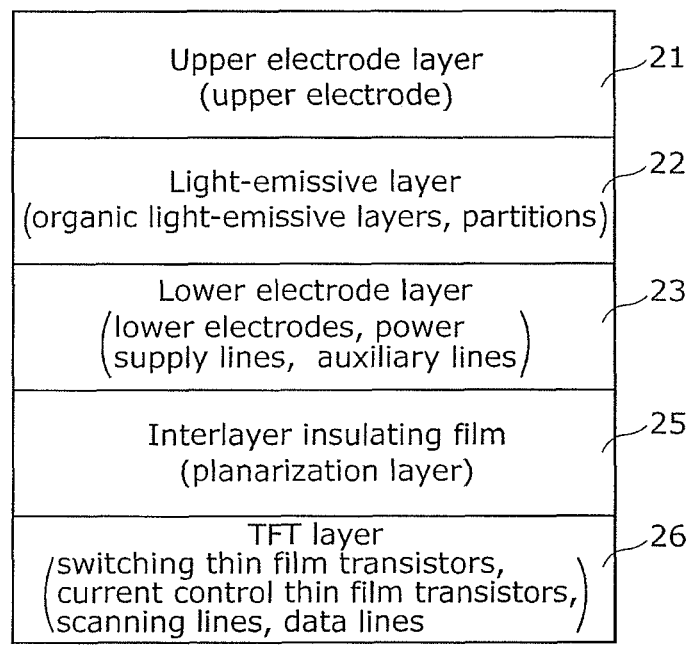
FIG. 2 is a schematic view showing a cross section of the organic EL display device.

FIG. 2 is a schematic view showing a cross section of the organic EL display device. The organic EL display device includes, in order starting from a substrate which is the lowermost layer not shown toward the uppermost layer, at least a TFT layer 26, an interlayer insulating film 25, a lower electrode layer 23, a light-emissive layer 22, and an upper electrode layer 21. The organic EL display device may have a top emission structure in which light from the light-emissive layer 22 is emitted upwardly passing through the upper electrode layer 21, or may have a bottom emission structure in which the light is emitted downwardly.

The TFT layer 26 is a layer which includes a circuit and lines formed above a substrate such as a silicon substrate or the like not shown. Specifically, the TFT layer 26 is a layer in which the switching thin film transistors 15, the current control thin film transistors 16, the capacitor 19, the scanning lines 12, and the data lines 13 are formed.

The interlayer insulating film 25 is an insulating layer formed at least above the scanning lines and the data lines in the TFT layer 26, and comprises organic compounds including a resin such as a polyimide resin and a polyacrylic resin.

If the organic EL display device employs the top emission structure, the interlayer insulating film 25 is, for example, a planarization layer for planarizing the TFT layer 26 to form the lower electrode layer 23 above the TFT layer 26. The film thickness of the interlayer insulating film 25 is set to be a value satisfying that a value ($\epsilon_r/d$) obtained by dividing the dielectric constant ($\epsilon_r$) of the interlayer insulating film 25 by the film thickness (d) of the interlayer insulating film 25 is smaller than $4\times10^{-6}$ $m^{-1}$, for example, 1 μm or greater. Such setting is made so that the parasitic capacitance C is smaller than a certain capacitance value because when the area of each of counter electrodes interposing the interlayer insulating film 25 is S and the permittivity of the vacuum is $\epsilon_0$, the parasitic capacitance C formed of the counter electrodes satisfies $C=\epsilon_r \cdot \epsilon_0 \cdot S/d$.

If the organic EL display device employs the top emission structure, the lower electrode layer 23 is a layer which includes an electric conductor comprising two or more metals from among aluminum (Al), silver (Ag), and copper (Cu). Specifically, the lower electrode layer 23 is a layer in which the lower electrodes (the anodes) of the organic EL elements 17, the power supply lines 11, and auxiliary lines are formed. If the organic EL display device employs the bottom emission structure, the lower electrodes (the anodes) are formed in a layer which includes an electric conductor comprising indium tin oxide (ITO) and indium zinc oxide (IZO), and the power supply lines 11, and the auxiliary lines are formed in a layer which includes an electric conductor comprising two or more metals from among aluminum (Al), silver (Ag), and copper (Cu). Here, the auxiliary lines are lines connected to the upper electrode of the organic EL elements 17.

The light-emissive layer 22 is a layer in which the organic light-emissive layers of the organic EL elements 17 and partitions which are banks for spacing the organic light-emissive layers for each emissive pixel 10 are formed. The organic light-emissive layers may be made of a polymeric organic material which includes a polymeric emissive material such as polyphenylenevinylene (PPV), the derivative (PPV derivative), polyfluorene (PFO), the derivative (PFO derivative), polyspirofluorene derivative, polythiophene, and the derivative, or may be made of a small molecule organic material which includes a small molecule emissive material such as oxinoid compounds, perylene compounds, umarin compounds, metal complexes with 8-hydroxyquinoline compounds, and the derivative. The partitions may be made of any of an inorganic substance and an organic substance. However, when forming an organic material which includes an emissive material and the processing involves a printing process, high water repellency is required. Thus, preferably, the partitions are made of a resin such as polyimide resin and a polyacrylic resin. It should be noted that the light-emissive layer 22 may include a hole injection layer for injecting holes into the organic light-emissive layer, a hole transport layer for transporting the holes from the hole injection layer to the organic light-emissive layer, and an electron injection layer for injecting electrons into the organic light-emissive layer.

The upper electrode layer 21 is a layer in which the upper electrode (the cathode) of the organic EL elements 17 is formed. The upper electrode layer 21 is a transparent electrode comprising indium tin oxide (ITO) or the like. The upper electrode layer 21 is connected to the auxiliary lines, and connects the upper electrode to the organic EL elements 17, which are included in all the emissive pixels 10, in a shared manner. The auxiliary lines are for reducing the wiring resistance of the upper electrode, i.e., a voltage drop which occurs at the upper electrode, and each referred to as a bus bar.

Next, the organic EL display device configured as set forth above will be described in detail.

Parts (a) and (b) of FIG. 3 are layout views of the lower electrode layer 23. Part (a) of FIG. 3 shows how sets of a lower electrode (R) for red emissive pixels, a lower electrode (G) for green emissive pixels, and a lower electrode (B) for blue emissive pixels in a set are disposed in a matrix.

Part (b) of FIG. 3 is a diagram showing components, other than the lower electrodes, formed in the lower electrode layer 23, i.e., showing positions of the power supply lines 11 (11a and 11b) and auxiliary lines 14. Part (b) of FIG. 3 has a positional correspondence in a plane to (a) of FIG. 3. As shown in (b) of FIG. 3, each power supply line 11 includes power supply lines 11a as main lines across the column direction of the organic EL display device, and the power supply lines 11b as branching lines which are extending in the row direction from the power supply lines 11a as the main lines of the branching lines and used connecting the emissive pixels. As can be seen from (b) of FIG. 3, the power supply lines 11a as the main lines and the auxiliary lines 14 are disposed in parallel (or side by side) with each other in the column direction, and the power supply lines 11a and the auxiliary lines 14 are alternately disposed. This eliminates the power supply line 11 and the auxiliary line 14 having different potentials from crossing each other, thereby reducing the frequency of occurrence of shorting defects caused by the power supply line 11 and the auxiliary line 14 in contact.

Part (a) of FIG. 4 is a layout view of the lower electrode layer 23 and the partitions 24 in the light-emissive layer 22 formed above the lower electrode layer 23. Parts (b) and (c) of FIG. 4 are cross-sectional views of the lower electrode layer 23 and the partitions 24 taken along AA' line and BB' line, respectively, in (a) of FIG. 4.

In (a) of FIG. 4, black grid indicates where the partitions 24 are disposed. As can be seen from (a) and (b) of FIG. 4, the partitions 24 are formed as insulating films for spacing (i.e., electrically insulating), from the upper electrode (the cathode), the organic light-emissive layers (more accurately, the lower electrodes) and the power supply line 11 for each emissive pixel.

Part (a) of FIG. 5 is a layout view of the lower electrode layer 23 (here, including first TFT contacts 23a and second TFT contacts 23b which are via contacts connected to the current control thin film transistors 16). Here, the first TFT contact 23a is a via contact that connects between a lower electrode 17c of the organic EL element 17 and the source of the current control thin film transistor 16 included in each emissive pixel 10. On the other hand, the second TFT contact 23b is a via contact that connects between the power supply line 11 (11b) and the drain of the current control thin film transistor 16 included in each emissive pixel 10.

In (a) of FIG. 5, the scanning line 12 and the data lines 13 that are disposed in the TFT layer 26 are also shown. Here, the scanning line 12 and the data lines 13 that are connected to a set of the emissive pixels (the red emissive pixel, the green emissive pixel, and the blue emissive pixel) are shown. The scanning line 12 is a line across the row direction of the organic EL display device, and disposed for each one row of the emissive pixels. Moreover, the data lines 13 are each disposed for each one column of the emissive pixels across the column direction of the organic EL display device.

Parts (b), (c), (d), and (e) of FIG. 5 are cross-sectional views of the organic EL display device taken along CC' line, DD' line, EE' line, and FF' line, respectively, in (a) of FIG. 5.

Part (b) of FIG. 5 is the cross-sectional view of the organic EL display device taken along the column direction (CC' line). Herein, upwardly from the lowermost layer, the TFT layer 26 (here, TFT circuits 26a, lines 26b), the interlayer insulating film 25, the lower electrode layer 23 (here, the lower electrodes 17c of the organic EL elements 17), the light-emissive layer 22 (here, an organic light-emissive layer 17b), and the upper electrode layer 21 (here, an upper electrode 17a of the organic EL elements) are shown. The TFT circuits 26a each include the switching thin film transistor 15, the current control thin film transistor 16, and the capacitor 19. The lines 26b are lines connected to the sources, drains, and gates of the switching thin film transistor 15 and the current control thin film transistor 16.

Part (c) of FIG. 5 is the cross-sectional view of the organic EL display device taken along a line (DD' line) on which the first TFT contacts 23a are disposed. Herein, upwardly from the lowermost layer, the TFT layer 26 (here, the TFT circuits 26a, the data lines 13), the interlayer insulating films 25, the lower electrode layer 23 (here, the lower electrodes 17c of the organic EL elements 17, the power supply line 11a), the light-emissive layer 22 (here, the partition 24), and the upper electrode layer 21 (here, the upper electrode 17a of the organic EL elements) are shown. Although not shown in the figure, as mentioned above, not only the lower electrodes 17c of the organic EL elements 17 and the power supply line 11, but also the auxiliary lines 14 each disposed in parallel with and alternately with the power supply line 11a are formed in the lower electrode layer 23.

Part (d) of FIG. 5 is a cross-sectional view of the organic EL display device taken long line (EE' line) on which the second TFT contacts 23b are disposed. Herein, upwardly from the lowermost layer, the TFT layer 26 (here, the TFT circuits 26a, the data lines 13), the interlayer insulating films 25, the lower electrode layer 23 (here, the power supply line 11b), the light-emissive layer 22 (here, the partition 24), and the upper electrode layer 21 (here, the upper electrode 17a of the organic EL elements) are shown.

Part (e) of FIG. 5 is a cross-sectional view of the organic EL display device taken along the row direction (FF' line) of the emissive pixels 10 of the organic EL display device. Herein, upwardly from the lowermost layer, the TFT layer 26 (here, the TFT circuits 26a, the data lines 13), the interlayer insulating films 25, the lower electrode layer 23 (here, the lower electrodes 17c of the organic EL elements 17, the power supply line 11a), the light-emissive layer 22 (here, the organic light-emissive layers 17b, the partitions 24), and the upper electrode layer 21 (here, the upper electrode 17a of the organic EL elements) are shown.

As shown in (c) to (e) of FIG. 5, not only the lower electrodes 17c of the organic EL elements 17 but also the power supply lines 11 (11a and 11b) are disposed in the lower electrode layer 23. Because of this, the power supply line 11a and the scanning line 12 ((a) of FIG. 5) which is disposed in the TFT layer 26 are perpendicular to each other, and at a cross-point, the power supply line 11a and the scanning line 12 are spaced from each other by the interlayer insulating film 25 having a thickness of 1 μm or greater. Thus, the parasitic capacitance formed of the power supply lines 11a and control lines including the scanning lines 12 and the data lines 13 is reduced as compared to the conventional technology in which the power supply lines and the control lines are formed in the same layer (for example, TFT layer), and allows signals at high frequency to be transmitted to the scanning lines 12 and the data lines 13. Moreover, since the power supply line 11a and the scanning line 12 are manufactured spaced from each other by the thickness of the interlayer insulating film 25, shorting defects are reduced and the yield rate of the organic EL display device improves, as compared to the conventional technology in which the power supply lines and the scanning lines are formed in the same layer (for example, TFT layer).

Moreover, in the present embodiment, to reduce the parasitic capacitance formed of the power supply lines 11, the scanning lines 12, and the data lines 13, a planarization layer (the interlayer insulating films 25) for planarizing the TFT layer 26 is used rather than providing a special spacing layer. Thus, the structure according to the present embodiment also has cost advantages.

Furthermore, in the organic EL display device according to the present embodiment, not only the lower electrodes 17c of the organic EL elements 17 but also the power supply lines 11 and the auxiliary lines 14 are formed in the lower electrode layer 23, and thus can be concurrently formed by one wiring process. Therefore, manufacturing cost is reduced as compared to the case requiring for multiple manufacturing processes.

Part (a) of FIG. 6 is a diagram showing a connection relationship between the power supply lines 11a, the auxiliary lines 14, and the emissive pixels 10 which are disposed in the lower electrode layer 23 of the organic EL display device according to the present embodiment. Part (b) of FIG. 6 is a diagram showing a connection relationship between the auxiliary lines 14 and the emissive pixels 10 in a conventional technology in which the power supply lines 11 are not disposed in the lower electrode layer 23.

As can be seen from (a) of FIG. 6, in the organic EL display device according to the present embodiment, the power supply lines 11a and the auxiliary lines 14 are disposed in parallel in the lower electrode layer 23 and alternately in the column direction of the organic EL display device. Thus, an average current applied to the auxiliary line 14 on each column is for two columns of pixels. On the other hand, as can be seen from (b) of FIG. 6, in the conventional technology, only the auxiliary lines 14 are disposed in the lower electrode layer 23. Thus, an average current applied to the auxiliary line 14 on each column is for one column of pixels.

The connection relationship between each power supply line 11a and the emissive pixels is similar to the connection relationship between each auxiliary line 14 and the emissive pixels. Specifically, in the organic EL display device according to the present embodiment, each power supply line 11a is connected to the emissive pixels (more properly, the current control thin film transistors 16 of the emissive pixels) positioned on both sides of the power supply line 11a.

As set forth above, the organic EL display device has been described with reference to a certain embodiment. However, the present disclosure is not limited to the present embodiment. Various modifications to the present embodiment that may be conceived by those skilled in the art are included in the present disclosure, without departing from the spirit of the present disclosure.

For example, in the present embodiment, the power supply lines 11a as the main lines and the power supply lines 11b as branching lines are disposed across the column direction and the row direction, respectively, in the lower electrode layer 23. However, only either the power supply lines 11a or 11b may be disposed in the lower electrode layer 23. This is because by at least a portion of the power supply lines 11 being formed above the interlayer insulating film 25 (the lower electrode layer 23), the parasitic capacitance formed between the scanning lines 12 disposed in the TFT layer 26 and the power supply lines, and between the data lines 13 disposed in the TFT layer 26 and the power supply lines 11 can be reduced.

Moreover, in the present embodiment, the interlayer insulating films 25 are set to have the film thickness of 1 μm or greater. However, as a precise film thickness, the interlayer insulating films 25 may be set to have a film thickness of 1 μm or greater at its thinnest point, or may be set to have a film thickness equal to or greater than 1 μm as compared to the film thickness of the TFT layer 26 in which the scanning lines 12 are formed.

Moreover, in the present embodiment, the TFT layer includes two TFTs and one capacitance. However, in general, a circuit is also proposed which includes three or more TFTs to compensate for the fluctuation in the characteristics or the variations of the drive transistors. The present disclosure is effective even in such a case.

Moreover, according to the present embodiment, the transistors formed in the TFT layer are of NMOS. However, the transistors may be of PMOS or a combination of NMOS and PMOS.

Moreover, according to the present embodiment, the upper electrode is cathode. However, the upper electrode may be anode.

Moreover, it will be appreciated that the organic EL display device one or more exemplary embodiments disclosed herein can be achieved as a display panel in which the emissive pixels are formed two dimensionally, but also as various electronic devices having display panels such as a TV 30 having a flat panel display as illustrated in FIG. 7.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The organic EL display device according to one or more exemplary embodiments disclosed herein are applicable to organic EL display devices such as display panels, TVs having display panels, mobile phones, computer displays, various monitors, and particularly to TVs and computer displays that have large screens or high resolution screens.

The invention claimed is:
1. An organic electro-luminescence (EL) display device comprising: above a substrate,
plural scanning lines;
plural data lines;
emissive pixels disposed near cross-points of the plural scanning lines and the plural data lines;
and power supply lines for supplying currents to the emissive pixels,
wherein the emissive pixels each have:
a switching thin film transistor having a gate to which a scan signal is supplied via one of the plural scanning lines;
a current control thin film transistor for controlling a current to be applied to the emissive pixel, in accordance with a voltage applied to a gate of the current control thin film transistor, the voltage being determined based on a data voltage supplied from one of the plural data lines to the gate of the current control thin film transistor via the switching thin film transistor; and
an organic EL element to which a current is supplied from one of the power supply lines via the current control thin film transistor, the organic EL element including a lower electrode, an organic light-emissive layer, and an upper electrode,
the organic EL display device further comprising:

a planarization layer provided above a layer in which the plural scanning lines and the plural data lines are disposed; and the power supply lines, the lower electrodes, and auxiliary lines electrically connected to the upper electrode, which are disposed above the planarization layer, wherein the power supply lines have points where the power supply lines cross the plural scanning lines, having the planarization layer disposed between the power supply lines and the plural scanning lines, and points where the power supply lines cross the plural data lines, having the planarization layer disposed between the power supply lines and the plural data lines.

2. The organic EL display device according to claim 1,
wherein the power supply lines are formed in a same layer as the lower electrodes.

3. The organic EL display device according to claim 1,
wherein the upper electrode is connected to the emissive pixels in a shared manner, and
the power supply lines are formed in a same layer as the auxiliary lines.

4. The organic EL display device according to claim 3,
wherein the power supply lines, the auxiliary lines, and the lower electrodes are formed in a same layer.

5. The organic EL display device according to claim 1,
wherein the planarization layer comprises organic compounds.

6. The organic EL display device according to claim 5,
wherein a value obtained by dividing a dielectric constant of the planarization layer by a film thickness of the planarization layer is smaller than $4 \times 10^{-6}$ m$^{-1}$.

7. The organic EL display device according to claim 1,
wherein the power supply lines are disposed in a direction perpendicular to the plural scanning lines.

8. The organic EL display device according to claim 7,
wherein partitions for spacing the organic light-emissive layers of the emissive pixels are disposed above the power supply lines.

9. The organic EL display device according to claim 3,
wherein the auxiliary lines are disposed in parallel with the power supply lines.

10. The organic EL display device according to claim 1,
wherein the power supply lines have points where the power supply lines cross the plural scanning lines, having the planarization layer disposed between the power supply lines and the plural scanning lines, and points where the power supply lines cross the plural data lines, having the planarization layer disposed between the power supply lines and the plural data lines, the points being in a region in which a multiple number of the emissive pixels are disposed.

11. The organic EL display device according to claim 1,
wherein the power supply lines include main lines disposed in a direction parallel with the plural data lines, and branching lines disposed in a direction parallel with the plural scanning lines,
the auxiliary lines are disposed in parallel with the branching lines of the power supply lines, and
the power supply lines are disposed in a same layer as the auxiliary lines.

* * * * *